United States Patent
Coleman et al.

(10) Patent No.: US 6,649,940 B2
(45) Date of Patent: Nov. 18, 2003

(54) SEPARATE LATERAL CONFINEMENT QUANTUM WELL LASER

(75) Inventors: James J. Coleman, Monticello, IL (US); Reuel B. Swint, Savoy, IL (US); Mark S. Zediker, Bridgeton, MO (US)

(73) Assignees: The Board of Trustees of the University of Illinois, Urbana, IL (US); Nuvonyx, Inc., Brigdeton, MO (US)

(*) Notice: Subject to any disclaimer, the term of this patent is extended or adjusted under 35 U.S.C. 154(b) by 0 days.

(21) Appl. No.: 09/897,152

(22) Filed: Jun. 29, 2001

(65) Prior Publication Data

US 2003/0006408 A1 Jan. 9, 2003

(51) Int. Cl.[7] .............................................. H01L 33/00
(52) U.S. Cl. .............................. 257/98; 372/45; 372/50
(58) Field of Search ........................ 372/45, 50; 257/98

(56) References Cited

U.S. PATENT DOCUMENTS

| 5,138,626 | A | | 8/1992 | Yap |
| 5,222,095 | A | | 6/1993 | Zediker et al. |
| 6,287,884 | B1 | * | 9/2001 | Jie et al. ...................... 438/39 |

FOREIGN PATENT DOCUMENTS

| EP | 0566494 | 4/1997 |
| EP | 0651478 | 5/1999 |

OTHER PUBLICATIONS

G.H. Thomson, P.A. Kirkby, "(GaAl) As lasers with a heterostructure for optical confinement and additional heterostructures for extreme carrier confinement," IEEE J. Quant. Elect., vol. QE–9, No. 2, pp. 318–323, 1973.

M.C. Amann, "Waveguiding analysis of mushroom stripe laser diodes," IEE Proc. vol. 135, No. 1, pp. 68–73, Feb. 1988.

J. Guthrie, G.L. Tan, M. Ohkubo, T. Fukushima, Y. Ikegami, T. Ijichi, M. Irikawa, R.S. Mand, J.M. Xu, "Beam instability in 980–nm–power lasers: Experiment and analysis," IEEE Phot. Tech. Lett., vol. 6, No. 12, pp. 1409–1411, Dec. 1994.

M.L. Xu, G.L. Tan, R. Clayton, and J.M. Xu, "Increased threshold for the first–order mode lasing in low–ridge waveguide high power QW lasers," IEEE Phot. Tech. Lett., vol. 8, No. 11, pp. 1444–1446, Nov. 1996.

S.P. Cheng, F. Brillouet, and P. Correc, "Design of quantum well AlGa–As–GaAs stripe lasers minimization of threshold current—application to ridge structures," IEEE J. of Q. Elect., vol. 24, No. 12, Dec. 1988.

S.Y. Hu, S.W. Corzine, K.K. Law, D.B. Young, A.C. Grossard, L.A. Coldren, and J.L. Merz, "Lateral carrier diffusion and surface recombination in InGaAs/AlGaAs quantum–well ridge waveguide lasers," J.Appl. Phys. vol. 76, No. 8, pp. 4479–4478, Oct. 1994.

S.L. Chuang, *Physics of Optoelectronic Devices*. New York: John Wiley & Sons, 1995, pp. 270–273.

G.P. Agrawal, Ed., *Semiconductor Lasers*. New York: American Institute of Physics, 1995.

(List continued on next page.)

*Primary Examiner*—Jerome Jackson
(74) *Attorney, Agent, or Firm*—Greer, Burns & Crain, Ltd.

(57) ABSTRACT

A semiconductor quantum well laser having separate lateral confinement of injected carriers and the optical mode. A ridge waveguide is used to confine the optical mode. A buried heterostructure confines injected carriers. A preferred embodiment laser of the invention is a layered semiconductor structure including optical confinement layers. A buried heterojunction quantum well within the optical confinement layers is dimensioned and arranged to confine injected carriers during laser operation. A ridge waveguide outside the optical confinement layers is dimensioned and arranged with respect to the buried heterojunction to confine an optical mode during laser operation. An index step created by the buried heterojunction is substantially removed from the optical mode.

11 Claims, 2 Drawing Sheets

OTHER PUBLICATIONS

T.M. Cockerill, D.V. Forbes, J.M. Dantzig, and J.J. Coleman, "Strained–layer InGaAs–GaAs–AlGaAs buried–heterostructure quantum–well lasers by three–step selective–area metalorganic chemical vapor deposition," IEEE J. of Q. Elect., vol. 30, No. 2, pp. 441–445, Feb. 1994.

Reithmaier, J.P., "Focused ion–beam implantation induced thermal quantum–well intermixing for monolithic optoelectronic device integration," IEEE J. Sel. Top. Quantum Electron., vol. 4, No. 4, pp. 595–605, Jul.–Aug. 1998.

Grupen, M., Ravaioli, U., Galick A., Hess K., Kerkhoven, T., "Coupling the electronic and optical problems in semiconductor quantum well laser simulations," Proc. SPIE—Int. Soc. Opt. Eng., vol. 2146, pp. 133–147, 1994.

Lage, H., Heitmann, D., Cingolani, R., Oestreich, M., "Linear and nonlinear optical properties of GaAs quantum wires–center–of–mass, excitonic and electron–hole plasma quantization," Phys. Scr. vol. T (Sweden), vol. T45, pp. 206–209, 1992.

Kish, F.A., Caracci, S.J., Maranowski, S.A., Holonyak, N., Jr., Smith, S.C., Burnham, R.D., "Planar native–oxide Al–sub x/Ga/sub 1–x/As–GaAs quantum well heterostructure ring laser diodes," Appl. Phys. Lett., vol. 60, No. 13, pp. 1582–1584, Mar. 1992.

Van Gieson, E., Meier, H.P., Harder, C., Buchmann, P., Webb, D., Walter, W., "High–performance GaAs/AlGaAs graded refractive index separate confinement heterostructure lasers grown by molecular–beam epitaxy on Si/sub 3/N/sub 4/masked substrates," J. Vac. Sci, Technol. B. Microelectron. Process. Phenom., vol. 7, No. 2, pp. 405–408, Mar.–Apr. 1989.

Dzurko, K.M., Menu, E.P., Beyler, C.A., Osinski, J.S., Dapkus, P.D., "Temperature engineered growth of low–threshold quantum well lasers by metalorganic chemical vapor desposition," Appl. Phys. Lett., vol. 54, No. 2, pp. 105–107, Jan. 1989.

* cited by examiner

SEPARATE LATERAL CONFINEMENT QUANTUM WELL LASER

FIELD OF THE INVENTION

The field of the invention is semiconductor quantum well lasers.

BACKGROUND OF THE INVENTION

Semiconductor lasers are the fundamental building block in compact optic and optoelectronic devices. Formed from Group III–V semiconductors, the semiconductor lasers emit laser light in response to electrical stimulation as electrons relax back to lower energy states and emit photons. Two conventional types of semiconductor lasers are buried heterostructure lasers (BH) and ridge waveguide (RW) lasers.

BH lasers are extremely effective at confining carriers. The lateral heterostructure of a BH also creates a large index step, which strongly confines the optical mode of the laser. Another result of the large index step, though, is the support of higher order modes. The higher order modes can give rise to beam instability, a large diffraction angle, and poor fiber coupling efficiency. A physically narrow BH device can defeat propagation of higher order modes, but provides a smaller available gain volume, higher optical power density at its facets, and larger diffraction angle of its emitted beam. Manufacturing narrower BH lasers also poses more difficult manufacture process control problems compared to otherwise similar wider devices. In general, the BH lasers are low threshold but high performance devices.

RW lasers can be made with a comparably smaller index step. The index step of an RW laser is controlled by controlling the depth of the ridge etch. RW lasers are easier to manufacture than BH lasers since the RW lasers require only a single crystal growth step. However, the RW lasers are less efficient than BH lasers. Due to unconfined spreading of carriers, a region outside of the ridge in an RW laser is also pumped leading to gain which is not effectively utilized. As a result, the threshold current of a RW laser can be twice as high as a comparable BH laser.

SUMMARY OF THE INVENTION

A semiconductor quantum well laser of the invention utilizes separate lateral confinement of injected carriers and the optical mode. A ridge waveguide is used to confine the optical mode. A buried heterostructure confines injected carriers. A preferred embodiment laser of the invention is a layered semiconductor structure including optical confinement layers. A buried heterojunction within the optical confinement layers is defined in a quantum well layer, and is dimensioned and arranged to confine injected carriers during laser operation. A ridge waveguide outside the optical confinement layers is dimensioned and arranged with respect to the buried heterojunction to confine an optical mode during laser operation. An index step created by the buried heterojunction is substantially removed from the optical mode.

BRIEF DESCRIPTION OF THE DRAWINGS

Other features, objects and advantages of the invention will be apparent to artisans from the detailed description and drawings, of which.

DETAILED DESCRIPTION OF THE PREFERRED EMBODIMENTS

A semiconductor quantum well laser of the invention utilizes separate lateral confinement of injected carriers and the optical mode. The separate lateral confinement is achieved by a ridge waveguide (RW) aligned over a buried heterostructure (BH) defined in a quantum well (QW). Various ones of the Group III–V material systems can be used to produce lasers in accordance with the invention. The preferred example of FIGS. 1(a) and 1(b) includes particular cladding and barrier layer materials, but the invention is not limited thereto. Instead, the inventive principles are found in the general structure of the preferred embodiment and, particularly, the separate lateral confinement achieved by that structure.

Figure 1A:
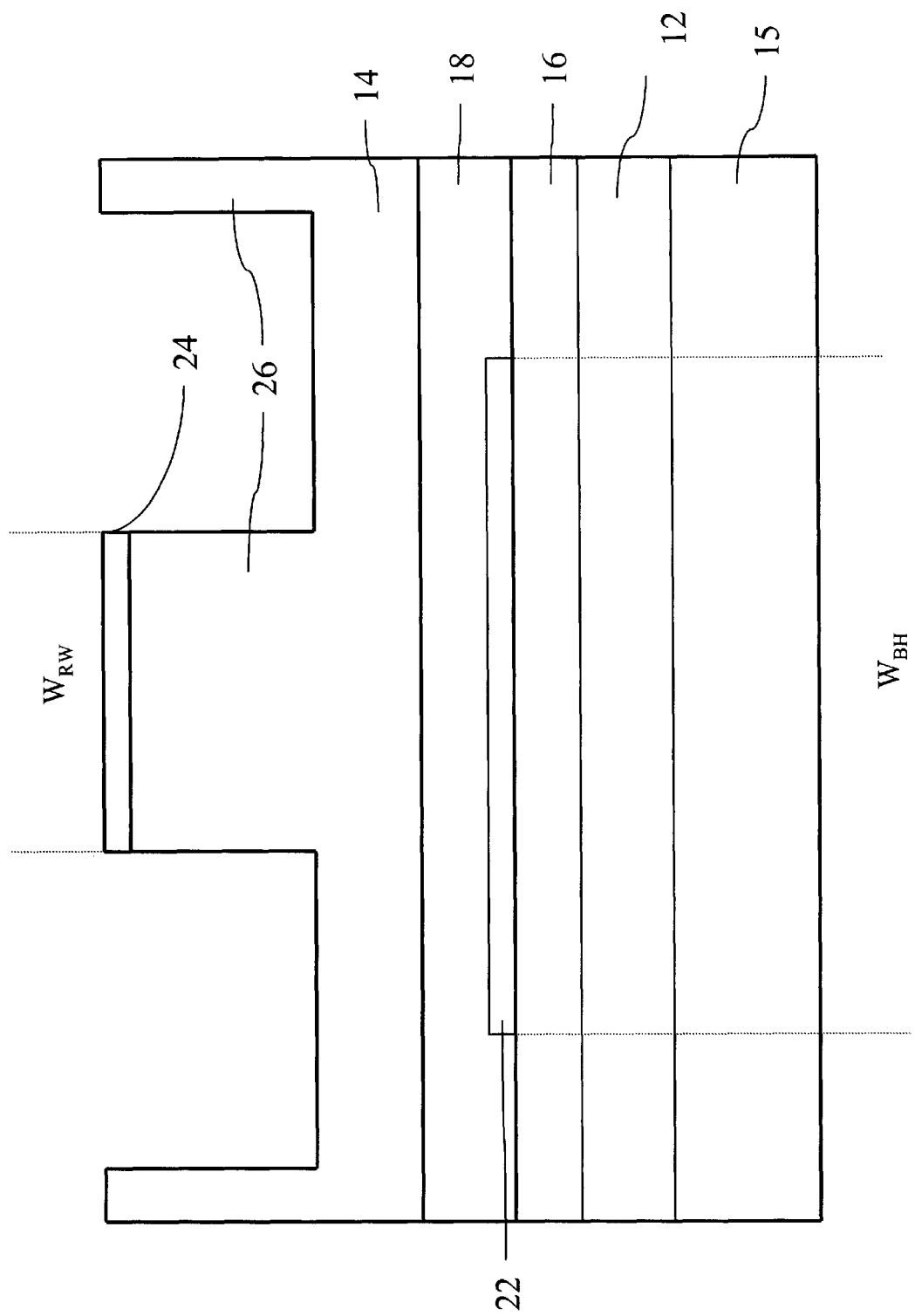
FIG. 1a is front side view of a laser in accordance with a preferred embodiment of the invention.
Figure 1B:
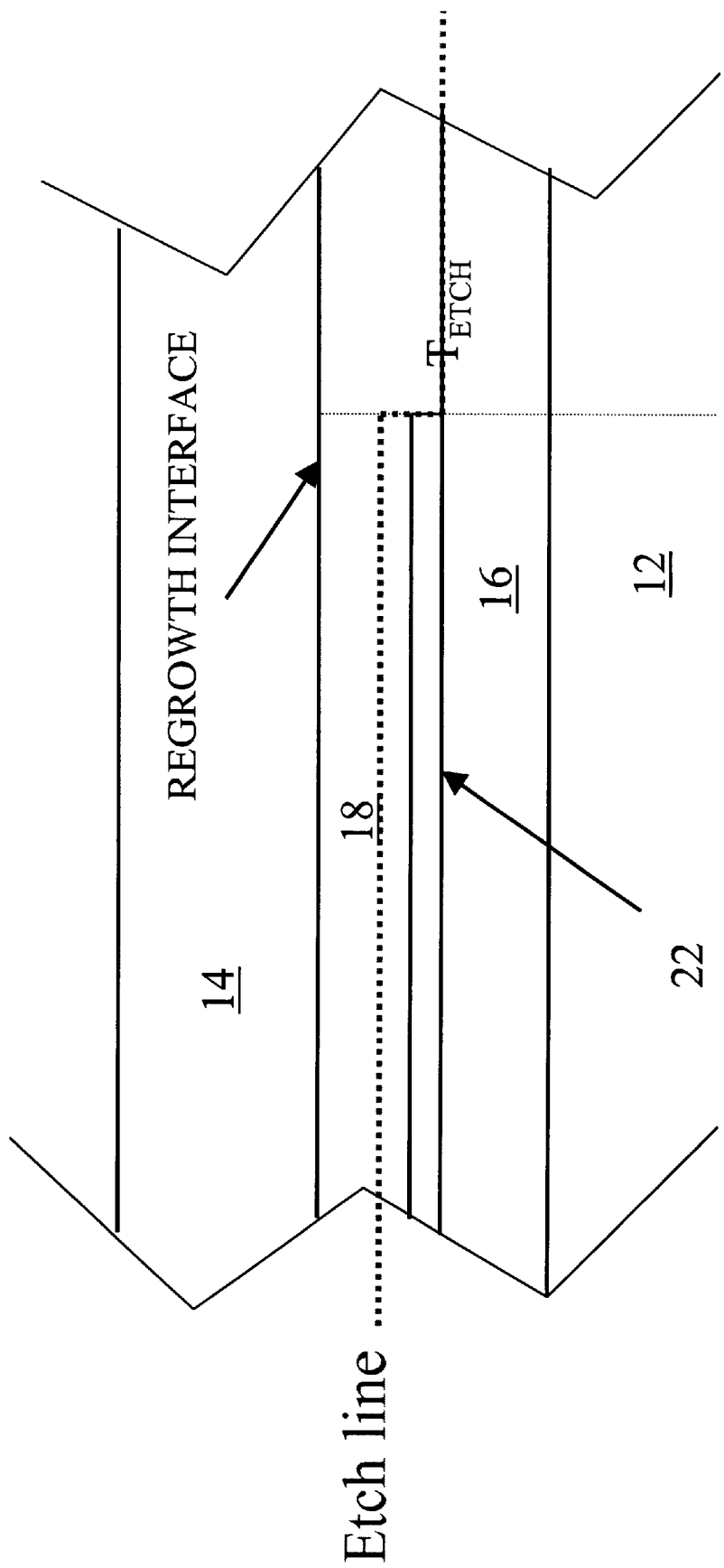
FIG. 1b is an enlarged portion of FIG. 1a, showing the buried heterojunction.

In FIGS. 1(a) and 1(b), the preferred semiconductor quantum well laser structure 10 includes $Al_{0.2}Ga_{0.8}As$ cladding layers 12, 14 formed on a n-GaAs buffer layer 15 and around intervening GaAs barrier layers 16, 18. The laser of the invention can be made in many other materials systems so the $Al_{0.2}Ga_{0.8}As$ material system is not limiting, but is just a preferred example. A quantum well $In_{0.28}Ga_{0.72}As$ BH 22 is formed at the interface of barrier layers 16 and 18. The QW BH layer is thin (a quantum well) to begin with and a BH formation step truncates it in the lateral direction. The result is a layer that is, for example, 4 or 5 $\mu$m wide but much thinner (0.005–0.01 $\mu$m). A RW 24 is defined in an upper part of the cladding layer 14 and a P+GaAs cap layer 26 caps the cladding layer 14. The etched RW 24, is aligned over, and preferably centered over, the wider BH quantum well 22. The RW 24 confines the laser's optical mode while the BH 22 formed in the quantum well confines injected carriers.

The index step created by the BH 22 is ideally minimal, but is at least substantially removed from the optical mode such that it has only a small effect on the index guide of the laser 10. The BH is nonetheless sufficiently narrow to limit lateral diffusion of the injected carriers, which have an effective diffusion length of about 2 $\mu$m. The inventors have calculated effective index of the FIGS. 1(a) and 1(b) structure for a 3.5 $\mu$m RW ($W_{RW}$) and a 6 $\mu$m BH ($W_{BH}$) as the lateral dimension varies along with the calculated intensity of the resulting optical mode. Both the RW 24 and the BH 22 create steps in the effective index. The RW 24 creates an inner index step and the BH 22 creates an outer (ideally minimal) index step. The weaker index guide created by the etched RW 24 can accommodate a wide optical mode and still maintain single lateral mode operation.

Although the threshold current of the laser of the invention will be slightly higher than a comparable BH laser due to the necessity of pumping a larger active volume, an offset in the required increased threshold current occurs because the entire width of the optical mode can propagate in a region of gain. The evanescent tail of the mode in the BH 22 may contain a significant fraction of the optical power, but it cannot contribute to stimulated emission since there is no gain outside of the index guide. This is accounted for in the standard equation for threshold current density $J_{th}$ in quantum well lasers by introducing a lateral gain confinement factor $\Gamma_{lat}$ that reduces the modal gain:

$$J_{th} = \frac{J_o}{\eta_i} \exp\left[\frac{\alpha - \frac{1}{L}\ln\frac{1}{R}}{\Gamma_{tr}\Gamma_{lat}J_o\beta}\right]$$

In equation (1), $J_o$, $\eta_i$, $\alpha$, $\beta$, $\Gamma_{tr}$, $\Gamma_{lat}$, and R are respectively the transparency current density, internal quantum efficiency, distributed loss, gain coefficient, cavity length, transverse confinement factor, lateral confinement factor, and facet reflectivity.

Prototype lasers according to the FIGS. 1(a) and 1(b) structure have been fabricated and tested. The prototypes were grown by a two-step metal organic chemical vapor deposition (MOCVD). Growths were done at atmospheric pressure at growth temperatures of 720° for AlGaAs cladding layers, 625° C. for an InGaAs quantum well buried heterostructure and GaAs barrier layers and 650° C. for a p+GaAs cap layer. The first growth consisted of an n-GaAs buffer layer (100 nm), an $Al_{0.2}Ga_{0.8}As$ lower cladding (1 $\mu$m), a GaAs barrier (200 nm), an $In_{0.28}Ga_{0.72}As$ quantum well (7 nm), and part of the upper GaAs barrier (30 nm). The prototypes were then patterned using standard photolithography in stripes ranging in width from 1 to 30 $\mu$m and etched through the quantum well to form a buried heterostructure. The etch depth was made as shallow as possible to minimize the index step created by the BH. The samples then underwent a surface preparation, were reloaded in the MOCVD reactor, and overgrown to form a BH similar to that created by selective area epitaxy in Cockerill et al., "Strained-layer InGaAs-GaAs-AlGaAs Buried-Heterostructure Quantum Well Lasers by Three-Step Selective-Area MOCVD," IEEE J. of Q. Elect., vol. 30, no 2, pp. 441–45 (February 1994), which is incorporated by reference herein. The final prototype structures have a 200 nm GaAs upper barrier, a 0.6 $\mu$m $Al_{0.2}Ga_{0.8}As$ upper cladding and a 0.1 $\mu$m p+ GaAs cap. A 3.5 $\mu$m wide optical RW centered over the BH is then formed by wet etching to a depth of ~0.5 $\mu$m. A 200 nm layer of plasma enhanced chemical vapor deposition $SiO_2$ was then deposited on prototypes, contact windows were opened on top of the RW, and Ti/Pt/Au metal contacts were deposited. Samples were then lapped and polished, Ge/Au contacts were deposited on the bottom of the wafer and alloyed at 400° C., and cleaved into 1 mm cavity lengths.

The index step created by the RW etch is calculated to be ~0.005. This was found experimentally to be the minimum index step necessary to defeat the anti-guiding effects of injected carriers and yield stable laser operation. Prototype samples were tested mounted p-side down in a clip and pulsed for 2 $\mu$s at 1.5 kHz. The lasing wavelength was near 1.03 $\mu$m. Lasers according the FIGS. 1(a) and 1(b) inventive structure and having a wide BH had the same threshold as conventional single grow RW lasers, indicating that the two step fabrication process is a high quality process. A clear reduction in threshold current was apparent for devices with BH widths of less than 10 $\mu$m. Near field images of the facets showed that the lasing mode was confined within thee etched RW, and the far field was single lobed. The lateral mode was confined within the etched RW of prototype devices, and the far field was single lobed. The lateral FWHM (full width half maximum) divergence angle for wide prototype BH (10–30 $\mu$m) was ~10°. The FWHM increases smoothly as the BH narrows, to approximately ~14° at a BH width of 4 $\mu$m. This occurs as the index step from the BH ($\Delta n$=~0.005) comes in closer proximity to the optical mode and contributes to index guiding.

General usefulness is thus demonstrated by the prototypes. Artisans will appreciate, however, the layer widths and materials may also be different from those in the prototypes. The prototypes show that the RW and BH may vary in width, and knowledge in the art also provides for different materials and layer thicknesses. Generally, those properties may vary with known conventional RW and known convention BH structures.

Accordingly, while a specific embodiment of the present invention has been shown and others described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A semiconductor quantum well laser structure formed on a buffer layer, comprising:
   semiconductor cladding layers;
   semiconductor barrier layers between said cladding layers;
   a semiconductor buried heterojunction between the barrier layers;
   a semiconductor cap layer;
   a semiconductor ridge waveguide having an index step outside of said cladding layers appropriate to attain desired lateral waveguide properties and vertically aligned over said buried heterojunction; and
   contacts to the laser structure.

2. The laser structure according to claim 1, wherein said buried heterojunction is dimensioned to have a small effect on an index guide of the laser structure and is sufficiently narrow to limit lateral diffusion of injected carriers.

3. The laser structure according to claim 1, wherein said ridge waveguide is centered over said buried heterostructure.

4. A semiconductor quantum well laser structure formed on a buffer layer, comprising:
   a layered semiconductor structure including optical confinement layers;
   a buried heterojunction within said optical confinement layers, the buried heterojunction being dimensioned and arranged to confine injected carriers during laser operation;
   a ridge waveguide outside said optical confinement layers having an index step appropriate to attain desired lateral waveguide properties, the ridge waveguide being dimensioned and arranged with respect to said buried heterojunction to confine an optical mode during laser operation, wherein an index step created by the buried heterojunction is substantially removed from the optical mode.

5. The laser structure according to claim 4, wherein said buried heterojunction is dimensioned to have a small effect on an index guide of the laser structure and is sufficiently narrow to limit lateral diffusion of injected carriers.

6. The laser structure according to claim 4, wherein said ridge waveguide is centered over said buried heterojunction.

7. A semiconductor quantum well laser structure, comprising semiconductor layers forming:
   a quantum well gain media;
   claddings around said quantum well gain media;
   a ridge waveguide separated from said quantum well gain media by one of said claddings; wherein said quantum well gain media extends laterally beyond lateral boundaries of said ridge waveguide.

8. The laser structure according to claim 7, wherein said quantum well gain media is laterally truncated beyond said lateral boundaries of said ridge waveguide.

9. A semiconductor quantum well laser structure, comprising semiconductor layers forming:
   a buried heterostructure separated from a ridge waveguide by a cladding; and
   an index step in said buried heterostructure outside of an index step of said ridge waveguide.

10. A semiconductor quantum well laser structure, comprising semiconductor layers forming:
    a buried heterostructure separated from a ridge waveguide by a cladding, wherein said buried heterostructure is laterally wider than said ridge waveguide.

11. The laser structure of claim 10, wherein said ridge waveguide is centered over said buried heterostructure.

* * * * *

UNITED STATES PATENT AND TRADEMARK OFFICE
CERTIFICATE OF CORRECTION

PATENT NO. : 6,649,940 B2 Page 1 of 1
DATED : November 18, 2003
INVENTOR(S) : Coleman et al.

It is certified that error appears in the above-identified patent and that said Letters Patent is hereby corrected as shown below:

Column 3,
Line 6, after "β", insert -- L, --;
Line 18, delete "p+GaAs" and insert -- p+ GaAs --.

Signed and Sealed this

Nineteenth Day of October, 2004

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,649,940 B2 | |
| APPLICATION NO. | : 09/897152 | |
| DATED | : November 18, 2003 | |
| INVENTOR(S) | : Coleman et al. | |

It is certified that error appears in the above-identified patent and that said Letters Patent is hereby corrected as shown below:

Column 1, line 3, before "FIELD OF THE INVENTION" insert the following:

-- STATEMENT OF GOVERNMENT INTEREST

This invention was made with Government assistance under National Science Foundation (NSF) Grant No. ECS 99-00258, and under Defense Advanced Research Projects Agency (DARPA) University Optoelectronics Center Program Grant No. ARMY UNM 3172 71-7830. The Government has certain rights in the invention. --

Signed and Sealed this

Fifteenth Day of July, 2008

JON W. DUDAS
*Director of the United States Patent and Trademark Office*